United States Patent
Yu et al.

(10) Patent No.: US 8,432,780 B1
(45) Date of Patent: Apr. 30, 2013

(54) VITERBI DECODING APPARATUS USING LEVEL INFORMATION GENERATOR SUPPORTING DIFFERENT HARDWARE CONFIGURATIONS TO GENERATE LEVEL INFORMATION TO VITERBI DECODER AND RELATED METHOD THEREOF

(75) Inventors: Chih-Ching Yu, Hsinchu (TW); Chih-Chung Li, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/468,048

(22) Filed: May 10, 2012

(51) Int. Cl.
    G11B 20/10 (2006.01)
(52) U.S. Cl.
    USPC .................................... 369/59.22; 369/59.17
(58) Field of Classification Search .................. None
    See application file for complete search history.

(56) References Cited

U.S. PATENT DOCUMENTS

| | | | |
|---|---|---|---|
| 4,500,994 A * | 2/1985 | McCallister et al. | 714/794 |
| 5,136,593 A | 8/1992 | Moon | |
| 5,148,287 A | 9/1992 | Kemmochi | |
| 5,379,306 A * | 1/1995 | Noma et al. | 714/792 |
| 5,402,445 A | 3/1995 | Matsuura | |
| 5,502,573 A | 3/1996 | Fujinami | |
| 5,619,539 A | 4/1997 | Coker | |
| 5,710,784 A | 1/1998 | Kindred | |
| 5,761,171 A | 6/1998 | Tobita | |
| 5,995,562 A | 11/1999 | Koizumi | |
| 6,111,833 A | 8/2000 | Nakagawa | |
| 6,198,420 B1 | 3/2001 | Ryan | |
| 6,201,652 B1 * | 3/2001 | Rezzi et al. | 360/40 |
| 6,459,394 B1 | 10/2002 | Nadi | |
| 6,625,235 B1 | 9/2003 | Coker | |
| 6,697,442 B1 | 2/2004 | Todoroki | |
| 6,865,661 B2 * | 3/2005 | Stein et al. | 712/15 |
| 6,892,344 B2 * | 5/2005 | Becker | 714/794 |
| 6,977,970 B2 | 12/2005 | Shim | |

(Continued)

FOREIGN PATENT DOCUMENTS

| | | |
|---|---|---|
| CN | 1133660 A | 10/1996 |
| CN | 1159103 A | 9/1997 |
| CN | 1574006 A | 2/2005 |
| CN | 101308685 A | 11/2008 |

OTHER PUBLICATIONS

Ohkubo et al, "Signal-To-Noise Ratio in a Partial-Response Maximum-Likelihood Detection", Japanese Journal of Applied Physics, vol. 43, No. 7B, 2004, pp. 4859-4862, The Japan Society of Applied Physics, Japan, Jul. 29, 2004.

*Primary Examiner* — Peter Vincent Agustin
(74) *Attorney, Agent, or Firm* — Winston Hsu; Scott Margo

(57) ABSTRACT

An exemplary Viterbi decoding apparatus includes a Viterbi decoder and a level information generator. The Viterbi decoder is arranged for generating a first binary signal by decoding an input signal according to target level information. The level information generator is arranged to support a plurality of different hardware configurations each for level information generation, and operate in a target hardware configuration among the different hardware configurations to generate the target level information to the Viterbi decoder. An exemplary Viterbi decoding method includes: configuring a level information generator, arranged to support a plurality of different hardware configurations each for level information generation, to operate in a target hardware configuration among the different hardware configurations for generating target level information; and generating a first binary signal by performing Viterbi decoding upon an input signal according to the target level information generated from the level information generator.

20 Claims, 9 Drawing Sheets

U.S. PATENT DOCUMENTS

| | | | |
|---|---|---|---|
| 7,082,056 B2 | 7/2006 | Chen | |
| 7,230,978 B2 * | 6/2007 | Bitterlich et al. | 375/219 |
| 7,236,108 B2 | 6/2007 | Cheng | |
| 7,277,507 B2 * | 10/2007 | Takagi | 375/341 |
| 7,356,097 B2 * | 4/2008 | Park et al. | 375/341 |
| 7,360,147 B2 | 4/2008 | Vasiliev | |
| 7,446,685 B1 | 11/2008 | Kikugawa | |
| 7,636,287 B2 | 12/2009 | Ohkubo | |
| 8,233,369 B2 | 7/2012 | Kim | |
| 2002/0119803 A1 * | 8/2002 | Bitterlich et al. | 455/552 |
| 2003/0103587 A1 * | 6/2003 | Becker | 375/341 |
| 2003/0140211 A1 * | 7/2003 | Stein et al. | 712/15 |
| 2004/0143722 A1 * | 7/2004 | Becker | 711/220 |
| 2005/0008102 A1 * | 1/2005 | Rapp et al. | 375/340 |
| 2005/0089121 A1 * | 4/2005 | Tsai et al. | 375/341 |
| 2005/0172210 A1 | 8/2005 | Sheaffer | |
| 2005/0180287 A1 | 8/2005 | Lee | |
| 2005/0182999 A1 | 8/2005 | Rudosky | |
| 2005/0249318 A1 * | 11/2005 | Minemura | 375/341 |
| 2005/0289445 A1 | 12/2005 | Fujiwara | |
| 2006/0023604 A1 | 2/2006 | Yamakawa | |
| 2006/0174183 A1 | 8/2006 | Ashley | |
| 2006/0193307 A1 | 8/2006 | Tomita | |
| 2006/0203631 A1 | 9/2006 | Wu | |
| 2007/0022357 A1 | 1/2007 | Chiou | |
| 2007/0121464 A1 | 5/2007 | He | |
| 2007/0195675 A1 | 8/2007 | Lee | |
| 2007/0279788 A1 | 12/2007 | Andersen | |
| 2008/0019261 A1 | 1/2008 | Nakai | |
| 2008/0232211 A1 * | 9/2008 | Vlutters | 369/47.51 |
| 2009/0193321 A1 * | 7/2009 | Park et al. | 714/795 |
| 2009/0202023 A1 | 8/2009 | Park | |
| 2009/0219793 A1 | 9/2009 | Zhao | |
| 2009/0276689 A1 | 11/2009 | Tan | |
| 2011/0090773 A1 | 4/2011 | Yu | |
| 2011/0090779 A1 | 4/2011 | Yu | |
| 2011/0261668 A1 | 10/2011 | Yu | |

* cited by examiner

VITERBI DECODING APPARATUS USING LEVEL INFORMATION GENERATOR SUPPORTING DIFFERENT HARDWARE CONFIGURATIONS TO GENERATE LEVEL INFORMATION TO VITERBI DECODER AND RELATED METHOD THEREOF

BACKGROUND

The disclosed embodiments of the present invention relate to Viterbi decoding, and more particularly, to a Viterbi decoding apparatus using a level information generator which supports different hardware configurations to generate required level information to a Viterbi decoder and related method thereof.

Generally speaking, a binarization process is necessary for converting an analog signal to a digital signal for further processing. Among various binarization apparatuses, the Viterbi decoder is known to be able to obtain the least erroneous binary signals. In general, the Viterbi decoder detects optimal binary data based on a statistical characteristic of an input signal. Specifically, the Viterbi decoder detects binary data having fewer errors as optimal binary data of an input signal by using a plurality of levels. For example, the branch metric calculation of the Viterbi decoder may be implemented to subtract a level from the received symbol of the input signal and derive a branch metric from the subtraction result. Therefore, the levels defined by the level information may affect the decoding performance of the Viterbi decoder. If the levels are not properly defined, the reading capability of an electronic device/system using the Viterbi decoder would be degraded. Thus, there is a need for an innovative level information generation design which is capable of providing optimized setting of the levels to the Viterbi decoder for improving the reading capability of the electronic device/system using the Viterbi decoder.

SUMMARY

In accordance with exemplary embodiments of the present invention, a Viterbi decoding apparatus using a level information generator which supports different hardware configurations to generate level information to a Viterbi decoder and related method thereof are proposed to solve the above-mentioned problem.

According to a first aspect of the present invention, an exemplary Viterbi decoding apparatus is disclosed. The exemplary Viterbi decoding apparatus includes a Viterbi decoder and a level information generator. The Viterbi decoder is arranged for generating a first binary signal by decoding an input signal according to target level information. The level information generator is arranged to support a plurality of different hardware configurations each for level information generation, and operate in a target hardware configuration among the different hardware configurations to generate the target level information to the Viterbi decoder.

According to a second aspect of the present invention, an exemplary Viterbi decoding method is disclosed. The exemplary Viterbi decoding method includes: configuring a level information generator, arranged to support a plurality of different hardware configurations each for level information generation, to operate in a target hardware configuration among the different hardware configurations for generating target level information; and generating a first binary signal by performing Viterbi decoding upon an input signal according to the target level information generated from the level information generator.

According to a third aspect of the present invention, an exemplary optical storage system is disclosed. The exemplary optical storage system includes an optical pickup unit, a signal processing unit, an analog-to-digital converter, and a Viterbi decoding apparatus. The optical pickup unit is arranged for accessing an optical storage medium. The signal processing unit is arranged for generating an analog radio frequency (RF) signal according to an output of the optical pickup unit. The analog-to-digital converter is arranged for converting the analog RF signal into a digital RF signal. The Viterbi decoding apparatus includes a Viterbi decoder and a level information generator. The Viterbi decoder is arranged for generating a binary signal by decoding the digital RF signal according to target level information. The level information generator is arranged to support a plurality of different hardware configurations each for level information generation, and operate in a target hardware configuration among the different hardware configurations to generate the target level information to the Viterbi decoder.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The concept of the present invention is to provide a Viterbi decoding apparatus employing a level information generator which supports a plurality of different hardware configurations, and generates target level information to a Viterbi decoder when operating in a target hardware configuration. For simplicity and clarity, an exemplary optical storage system having the proposed Viterbi decoding apparatus employed therein is detailed hereinafter for illustration of technical features of the proposed Viterbi decoding apparatus. However, this is for illustrative purposes only, and is not meant to be a limitation of the present invention. In other words, the proposed Viterbi decoding apparatus is not limited to the optical storage application, and the input signal to be processed by the proposed Viterbi decoding apparatus is not required to be derived from an optical storage medium. In practice, the proposed Viterbi decoding apparatus may be employed in any electronic device/system which requires Viterbi decoding. Hence, with the help of the proposed Viterbi decoding apparatus, the objective of improving the reading capability of an electronic device/system (e.g., an optical storage system or other signal processing system) is achieved.

Figure 1:
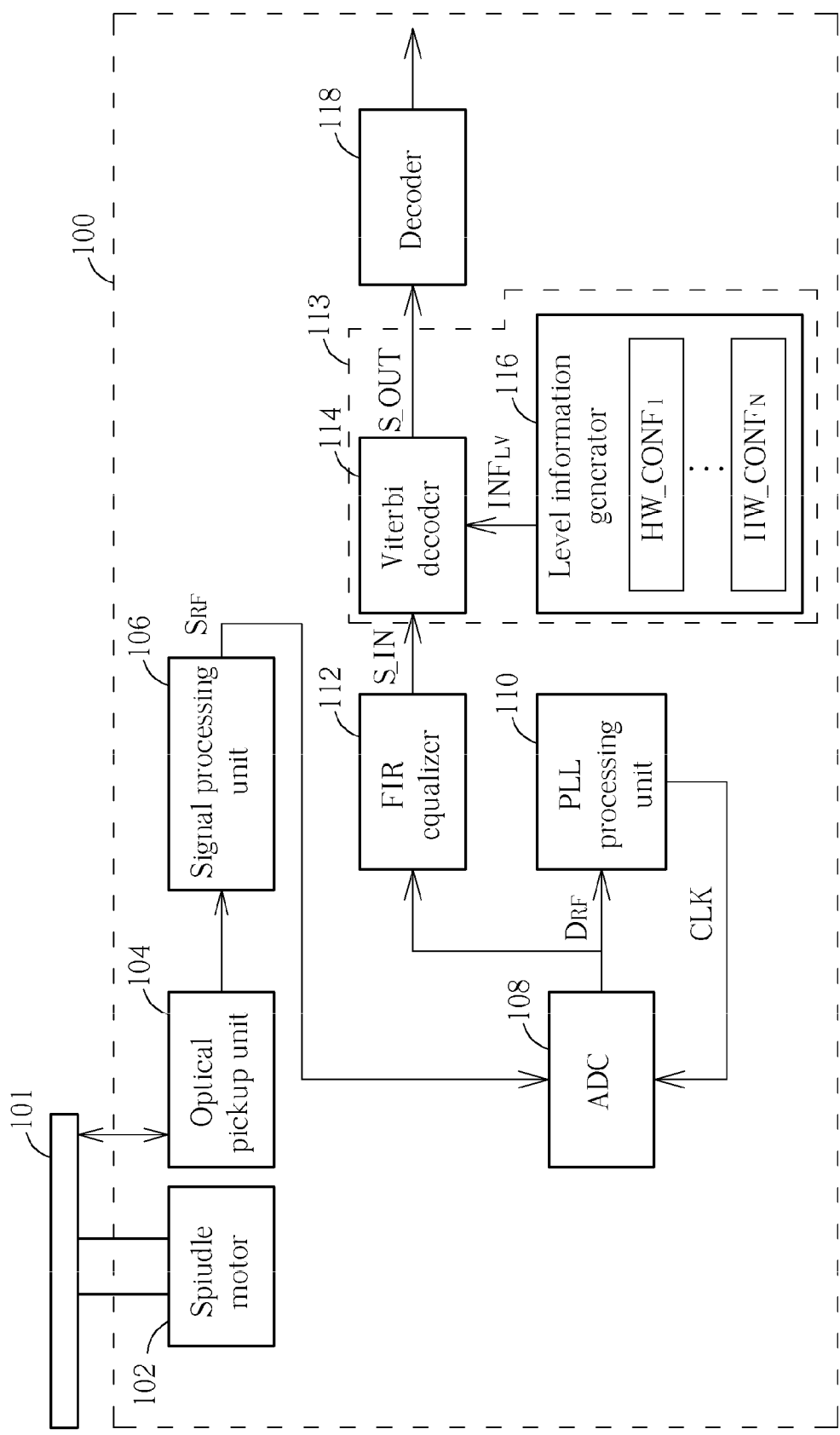
FIG. 1 is a diagram illustrating an optical storage system according to an exemplary embodiment of the present invention.

FIG. 1 is a diagram illustrating an optical storage system according to an exemplary embodiment of the present invention. The optical storage system 100 is used for accessing an optical storage medium 101. For example, the optical storage system 100 is an optical disc drive, and the optical storage medium 101 is an optical disc. As shown in FIG. 1, the optical storage system 100 includes a spindle motor 102, an optical pickup unit 104, a signal processing unit 106, an analog-to-digital converter (ADC) 108, a phase-locked loop (PLL) processing unit 110, a finite impulse response (FIR) equalizer 112, a Viterbi decoding apparatus 113, and a decoder 118. The Viterbi decoding apparatus 113 includes a Viterbi decoder 114 and a level information generator 116. The spindle motor 102 is used to rotate the optical storage medium 101 at the desired rotational speed. The optical pickup unit 104 is used to emit laser beams upon the optical storage medium 101, and detect signals reflected from the optical storage medium 101. The signal processing unit 106 is used to process the output of the optical pickup unit 104, and generate an analog RF signal $S_{RF}$. The ADC 108 converts the analog RF signal $S_{RF}$ into a digital RF signal (i.e., digitized data) $D_{RF}$. The PLL processing unit 110 is used to generate a clock signal CLK synchronized with the analog RF signal $S_{RF}$ according to the digital RF signal $D_{RF}$, where the clock signal CLK may be used by one or more internal components of the optical storage system 100. The digital RF signal $D_{RF}$ is also fed into the FIR equalizer 112, which is used to optimize the channel characteristics for providing equalized RF data as an input signal S_IN of the following Viterbi decoder 114.

The Viterbi decoder 114 is used to perform Viterbi decoding upon the input signal S_IN according to the level information $INF_{LV}$, and generate a binary signal S_OUT as its output. The input signal S_IN is derived from reading information from the optical storage medium 101 when the Viterbi decoding apparatus 113 is employed in the optical storage system 100. Alternatively, the input signal S_IN may be derived from other signal source when the Viterbi decoding apparatus 113 is employed in an electronic device/system different from the optical storage system 100.

Specifically, the level information $INF_{LV}$ defines levels (or states) each corresponding to one characteristic of the input signal S_IN. Next, the decoder 118 decodes the binary signal S_OUT to extract the desired data. In this exemplary embodiment, the level information generator 116 is arranged to support a plurality of different hardware configurations $HW\_CONF_1$-$HW\_CONF_N$ each for level information generation. In other words, the hardware configurations $HW\_CONF_1$-$HW\_CONF_N$ may make the level information have different level settings/definitions when employed by the level information generator 116. When the level information generator 116 operates in a target hardware configuration among the different hardware configurations, the target level information $INF_{LV}$ generated due to the employed target hardware configuration is supplied to the Viterbi decoder 114. In this way, a more accurate setting/definition of the levels may be supplied to the Viterbi decoder 114 for improving the Viterbi decoding accuracy and stability, which also improves the reading capability of the optical storage system 100 or other electronic device/system which uses the Viterbi decoding apparatus 113. Further details of the Viterbi decoding apparatus 113 are described as below.

Figure 2:
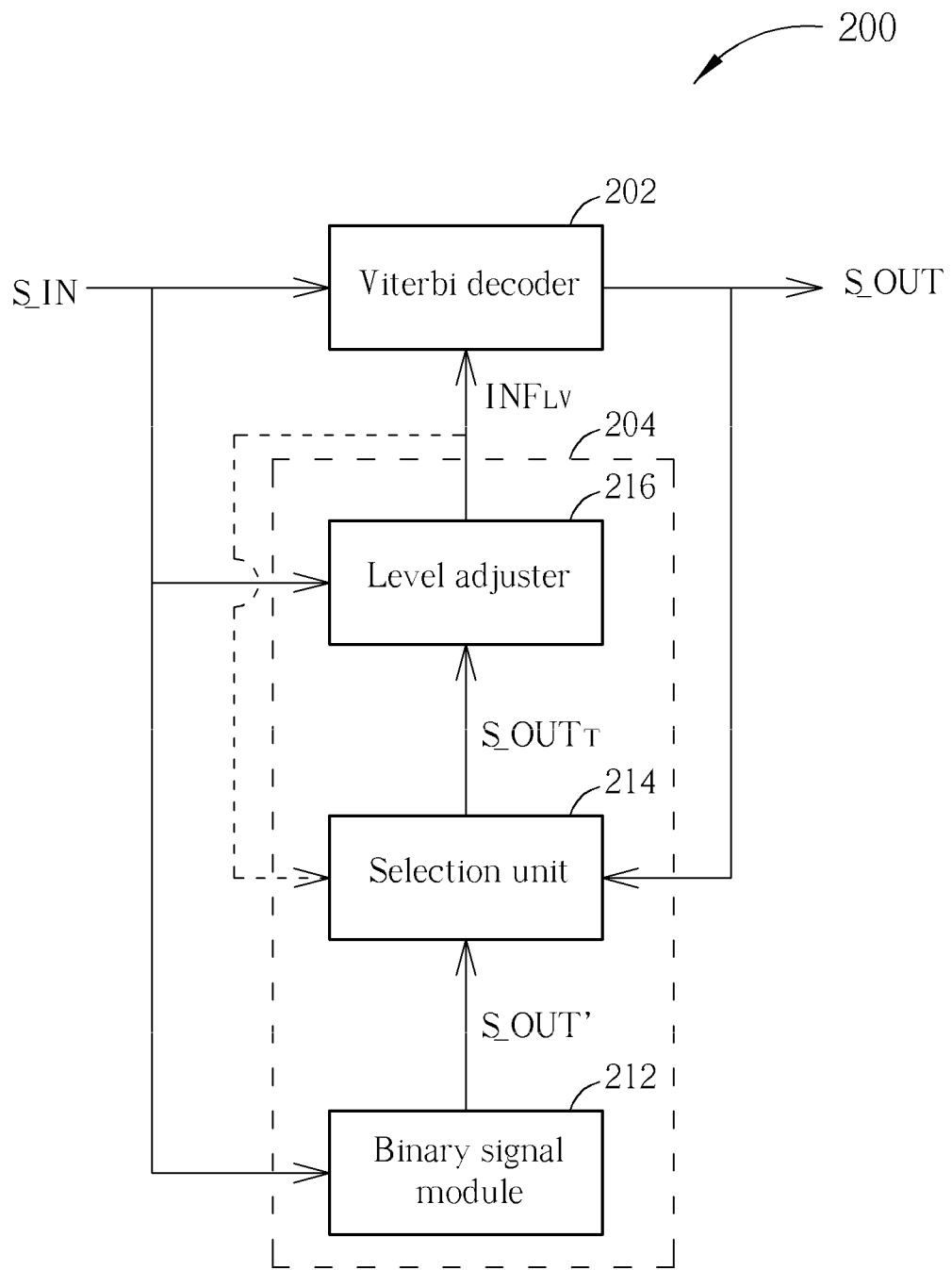
FIG. 2 is a diagram illustrating a first exemplary implementation of the Viterbi decoding apparatus according to an exemplary embodiment of the present invention.

FIG. 2 is a diagram illustrating a first exemplary implementation of the Viterbi decoding apparatus according to an exemplary embodiment of the present invention. By way of example, but not limitation, the Viterbi decoding apparatus 113 shown in FIG. 1 may be implemented by the Viterbi decoding apparatus 200 shown in FIG. 2. Actually, any electronic device/system using the Viterbi decoding apparatus 200 falls within the scope of the present invention. In this exemplary implementation, the Viterbi decoding apparatus 200 includes a Viterbi decoder 202 and a level information generator 204. The Viterbi decoder 202 is arranged for generating the binary signal S_OUT by decoding the input signal S_IN (e.g., an input derived from the optical storage medium 101 or other signal source) according to target level information $INF_{LV}$. Regarding the level information generator 204, it is arranged for receiving the input signal S_IN and the binary signal S_OUT, deriving another binary signal S_OUT' from the input signal S_IN, and generating the target level information $INF_{LV}$ to the Viterbi decoder 202 according to at least the binary signals S_OUT and S_OUT'. Specifically, the level information generator 204 includes a binary signal module 212, a selection unit 214, and a level adjuster 216, and supports two hardware configurations controlled by the selection unit 214. The binary signal module 212 is arranged for processing the input signal S_IN to generate the binary signal S_OUT'. By way of example, but not limitation, the binary signal module 212 may be simply realized by a slicer. The selection unit 214 is arranged for selecting a target binary signal $S\_OUT_T$ from the binary signals S_OUT and S_OUT' when the level information generator 204 operates in the target hardware configuration. The level adjuster 216 is arranged for generating the target level information $INF_{LV}$ according to at least the target binary signal $S\_OUT_T$.

When the Viterbi output (i.e., the binary signal S_OUT) is used as a level adjuster input, the decoding accuracy of the Viterbi decoder 202 is improved, thereby allowing the optical storage system to have better reading capability. However, as the recording density of the optical storage medium is increased for storing more data, the channel bit length and track pitch are reduced, which increases the difficulty in reading data from the optical storage medium. As a result, the quality of the regenerated signal may be deteriorated when the optical storage medium has defect areas, high jitter, etc. For example, when data is from a defect area on an optical disc (e.g., an area damaged by scratch), the amplitude of the corresponding RF signal would be quite small. When the Viterbi output (i.e., the binary signal S_OUT) is used as a level adjuster input, a resultant level adjuster output may include diverged levels, leading to a poorer decoder output. However, if the binary signal S_OUT' is used as the level adjuster input, the undesired level divergence problem may be avoided or mitigated. Based on such an observation, the present invention therefore proposes the selection unit 214, which supplies a better level adjuster input selected from the binary signals S_OUT and S_OUT' to the level adjuster 216. It should be noted that the level adjuster 216 may be implemented using any feasible hardware structure which can generate the level information according to a level adjuster input, either the binary signal S_OUT or the binary signal S_OUT'.

Figure 3:
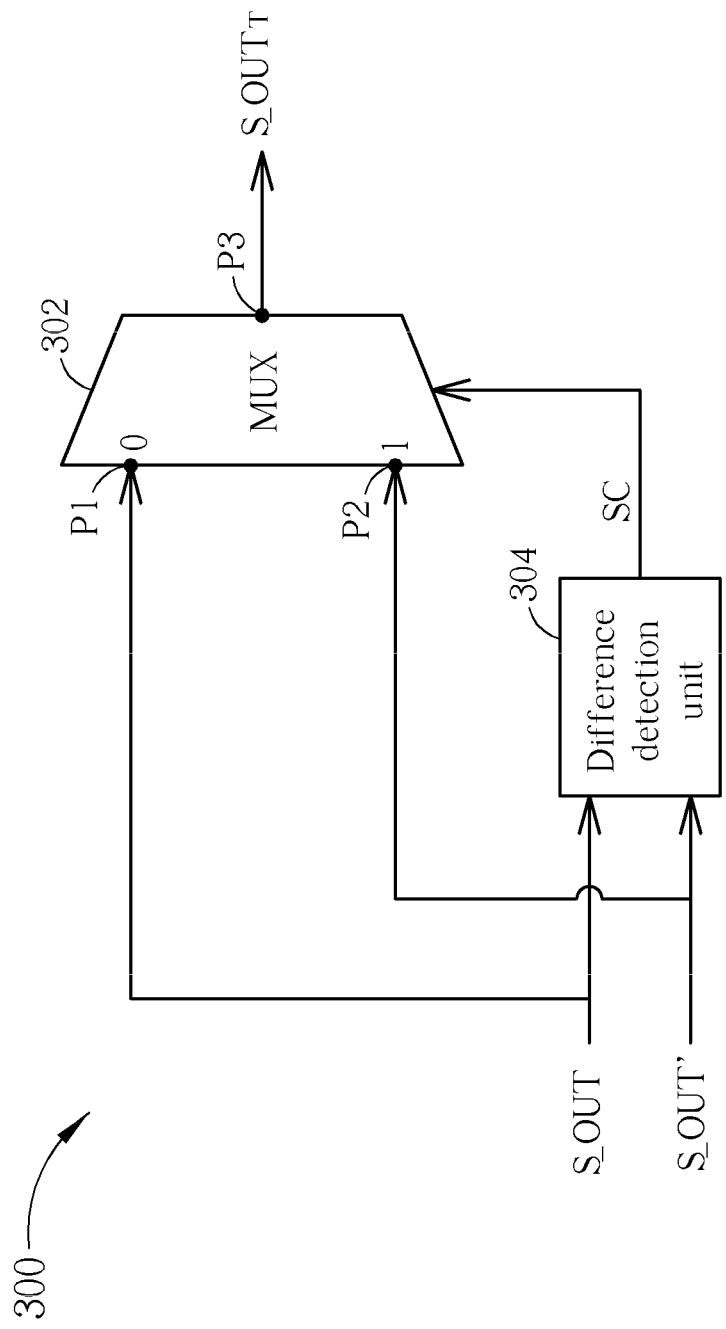
FIG. 3 is a diagram illustrating a first exemplary implementation of the selection unit shown in FIG. 2 according to an exemplary embodiment of the present invention.

FIG. 3 is a diagram illustrating a first exemplary implementation of the selection unit 214 shown in FIG. 2 according to an exemplary embodiment of the present invention. The selection unit 214 shown in FIG. 2 may be implemented by the selection unit 300 shown in FIG. 3. In this exemplary implementation, the selection unit 300 includes a multiplexer (MUX) 302 and a difference detection unit 304. The MUX 302 has a first input port P1 for receiving the binary signal S_OUT, a second input port P2 for receiving the binary signal S_OUT', and an output port P3 for outputting the target binary signal $S\_OUT_T$. The MUX 302 is arranged to selectively couple the first input port P1 or the second input port P2 to the output port P3 according to a control signal SC generated from the difference detection unit 304.

The difference detection unit 304 is arranging for detecting difference between the binary signals S_OUT and S_OUT', and generating the control signal SC according to a detection result. By way of example, but not limitation, the difference detection unit 304 may compare two aligned bit sequences, including a first bit sequence of the binary signal S_OUT and a second bit sequence of the binary signal S_OUT', and count the number of bit positions at which bits of the first bit sequence are different from bits of the second bit sequence. Next, the detection result is determined according to the counter value. For example, considering that each of the first bit sequence and the second bit sequence has 100 bits, the detection result is indicative of occurrence of level divergence in the current level information used by the Viterbi decoder 202 when the counter value reaches a threshold value (e.g., 20). Otherwise, the detection result is not indicative of occurrence of level divergence in the current level information. Next, the difference detection unit 304 sets the logic value of the control signal SC according to the detection result. When the detection result is indicative of occurrence of level divergence in the current level information, the control signal SC is set by a logic value "1" for instructing the MUX 302 to output the binary signal S_OUT' (i.e., an output of the binary signal module 212) as the target binary signal $S\_OUT_T$. Hence, the target hardware configuration employed by the level information generator 204 would include the binary signal module 212, the difference detection unit 304, the MUX 302 with the output port P3 connected to the second input port P2 and disconnected from the first input port P1, and the level adjuster 216. When the detection result is not indicative of occurrence of level divergence in the level information, the control signal SC is set by a logic value "0" for instructing the MUX 302 to output the binary signal S_OUT (i.e., a Viterbi output) as the target binary signal $S\_OUT_T$. Hence, the target hardware configuration employed by the level information generator 204 would include the binary signal module 212, the difference detection unit 304, the MUX 302 with the output port P3 connected to the first input port P1 and disconnected from the second input port P2, and the level adjuster 216. To put it simply, by adaptively switching the level information generator 204 between different hardware configurations, optimized decoding performance of the Viterbi decoding apparatus as well as improved reading capability of the optical storage system are achieved.

Figure 4:
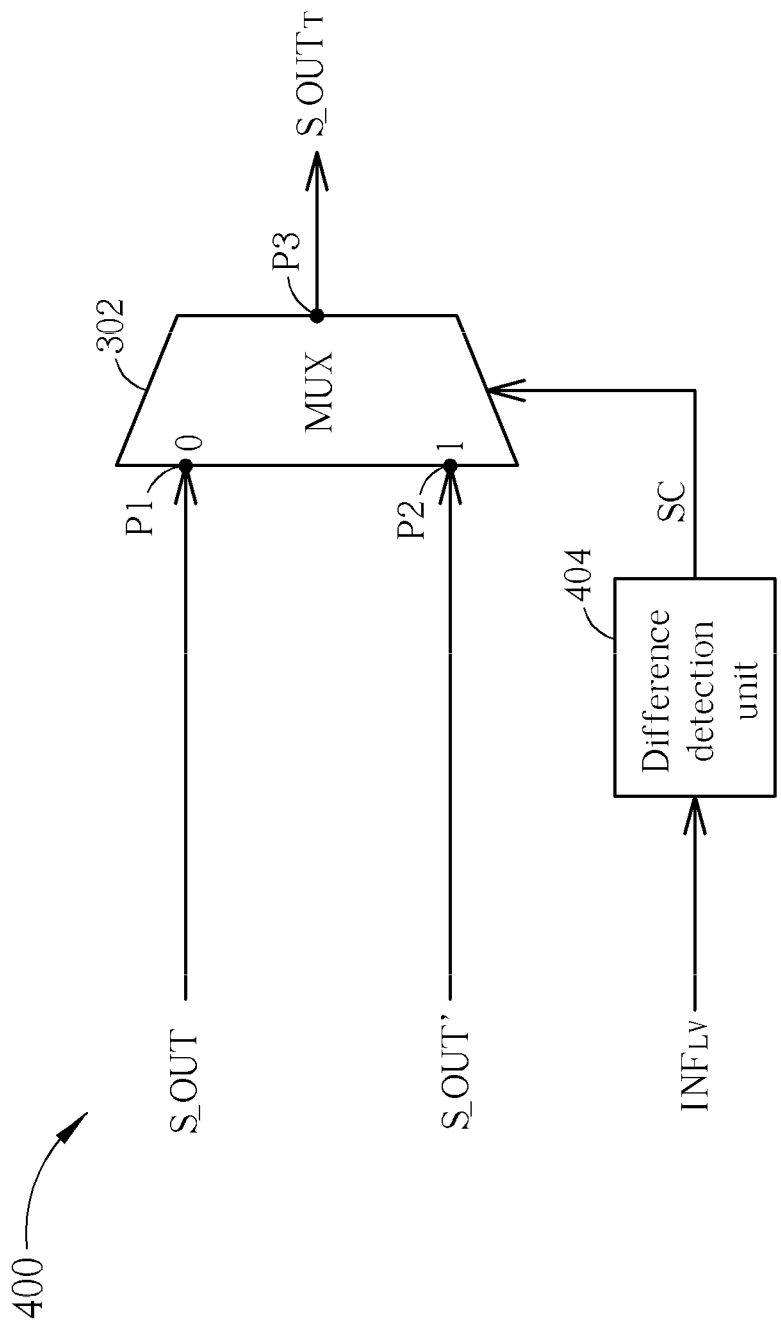
FIG. 4 is a diagram illustrating a second exemplary implementation of the selection unit shown in FIG. 2 according to an exemplary embodiment of the present invention.

FIG. 4 is a diagram illustrating a second exemplary implementation of the selection unit 214 shown in FIG. 2 according to an exemplary embodiment of the present invention. The selection unit 214 shown in FIG. 2 may be implemented by the selection unit 400 shown in FIG. 4. In this exemplary implementation, the selection unit 400 includes a divergence detection unit 404 and the aforementioned MUX 302, where the MUX 302 selectively couples the first input port P1 or the second input port P2 to the output port P3 according to the control signal SC generated from the divergence detection unit 404. Regarding this exemplary embodiment, the selection unit 214 implemented using the selection unit 400 is further coupled to an output of the level adjuster 216, as indicated by the dashed line shown in FIG. 2. Hence, the divergence detection unit 404 is arranging for checking the output of the level adjuster 216 (i.e., the current level information $INF_{LV}$ used by the Viterbi decoder 202) to detect level divergence in the output of the level adjuster 216, and generating the control signal SC according to a detection result.

By way of example, but not limitation, the divergence detection unit 404 may determine the detection result by comparing adjacent levels defined in the current level information $INF_{LV}$ used by the Viterbi decoder 202. For example, the detection result is indicative of occurrence of level divergence in the current level information when the difference between checked adjacent levels is smaller than a threshold value or the magnitude order of checked adjacent levels is swapped. Otherwise, the detection result is not indicative of occurrence of level divergence in the current level information. Next, the divergence detection unit 404 sets the logic value of the control signal SC according to the detection result. When the detection result is indicative of occurrence of level divergence in the level information, the control signal SC is set by a logic value "1" for instructing the MUX 302 to output the binary signal S_OUT' as the target binary signal $S\_OUT_T$. Hence, the target hardware configuration employed by the level information generator 204 would include the binary signal module 212, the divergence detection unit 404, the MUX 302 with the output port P3 connected to the second input port P2 and disconnected from the first input port P1, and the level adjuster 216. When the detection result is not indicative of occurrence of level divergence in the level information, the control signal SC is set by a logic value "0" for instructing the MUX 302 to output the binary signal S_OUT as the target binary signal $S\_OUT_T$. Hence, the target hardware configuration employed by the level information generator 204 would include the binary signal module 212, the divergence detection unit 404, the MUX 302 with the output port P3 connected coupled to the first input port P1 and disconnected from the second port P2, and the level adjuster 216. To put it simply, by adaptively switching the level information generator 204 between different hardware configurations, optimized decoding performance of the Viterbi decoding apparatus as well as improved reading capability of the optical storage system is achieved.

Figure 5:
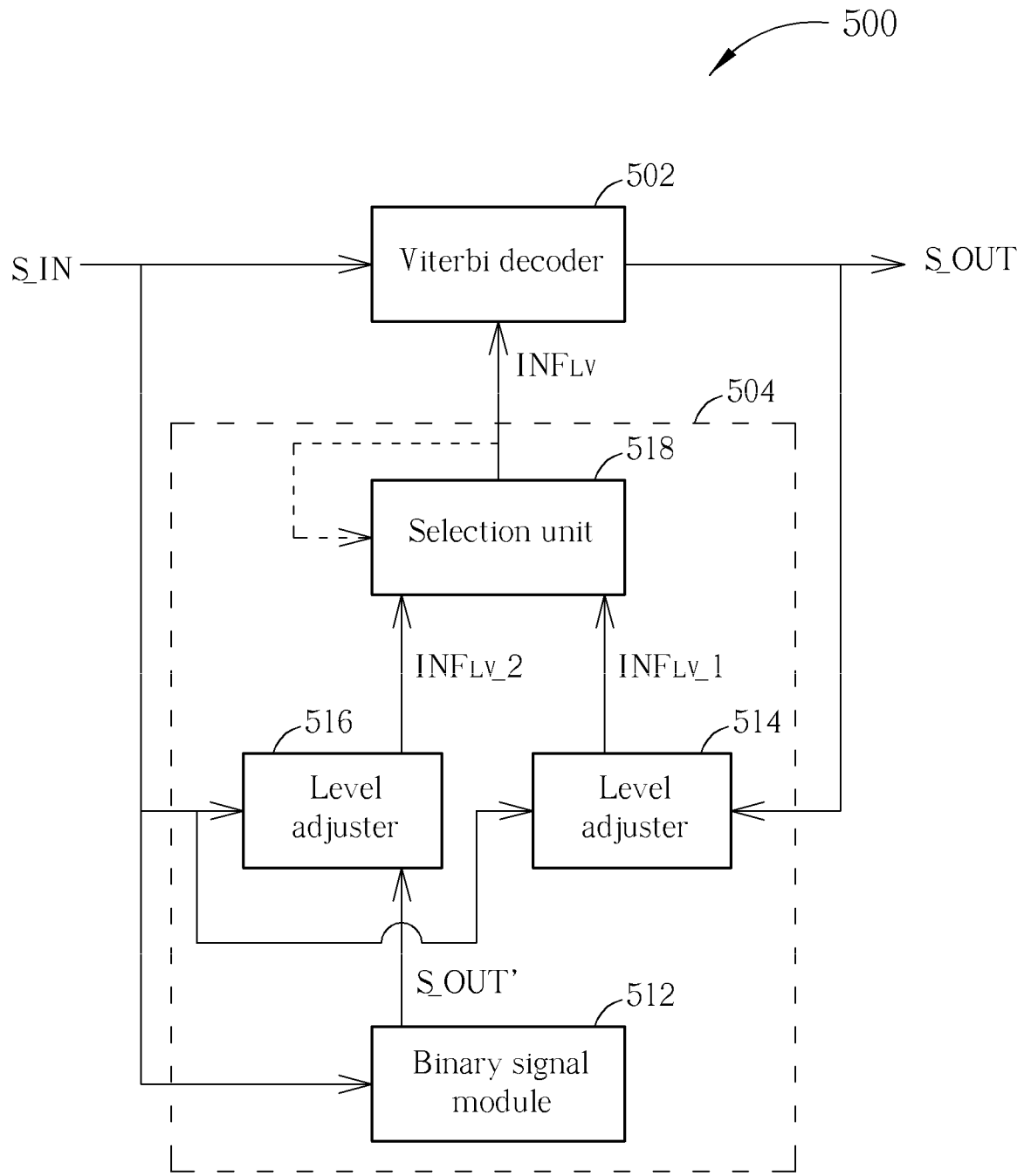
FIG. 5 is a diagram illustrating a second exemplary implementation of the Viterbi decoding apparatus according to an exemplary embodiment of the present invention.

FIG. 5 is a diagram illustrating a second exemplary implementation of the Viterbi decoding apparatus according to an exemplary embodiment of the present invention. By way of example, but not limitation, the Viterbi decoding apparatus 113 shown in FIG. 1 may be implemented by the Viterbi decoding apparatus 500 shown in FIG. 5. Actually, any electronic device/system using the Viterbi decoding apparatus 500 falls within the scope of the present invention. In this exemplary implementation, the Viterbi decoding apparatus 500 includes a Viterbi decoder 502 and a level information generator 504. The Viterbi decoder 502 is arranged for generating the binary signal S_OUT by decoding the input signal S_IN (e.g., an input derived from the optical storage medium 101 or other signal source) according to target level information $INF_{LV}$. Regarding the level information generator 504, it is arranged for receiving the input signal S_IN and the binary signal S_OUT, deriving another binary signal S_OUT' from the input signal S_IN, and generating the target level information $INF_{LV}$ according to at least the binary signals S_OUT and S_OUT'. Specifically, the level information generator 504 includes a binary signal module 512, a plurality of level adjusters 514, 516, and a selection unit 518, and supports two hardware configurations controlled by the selection unit 518. The binary signal module 512 is arranged for processing the input signal S_IN to generate the binary signal S_OUT'. By way of example, but not limitation, the binary signal module 512 may be simply realized by a slicer. The level adjuster 514 is arranged for generating level information $INF_{LV\_1}$ according to at least the binary signal S_OUT. The level adjuster 516 is arranged for generating level information $INF_{LV\_2}$ according to at least the binary signal S_OUT'. It should be noted that the level adjuster 514/516 may be implemented using any feasible hardware structure which can generate the level information $INF_{LV\_1}/INF_{LV\_2}$ according to a level adjuster input (i.e., the binary signal S_OUT/S_OUT'). The selection unit 518 is arranged for selecting the target level information $INF_{LV}$ from the level information $INF_{LV\_1}$ and $INF_{LV\_2}$ when the level information generator 504 operates in the target hardware configuration.

Figure 6:
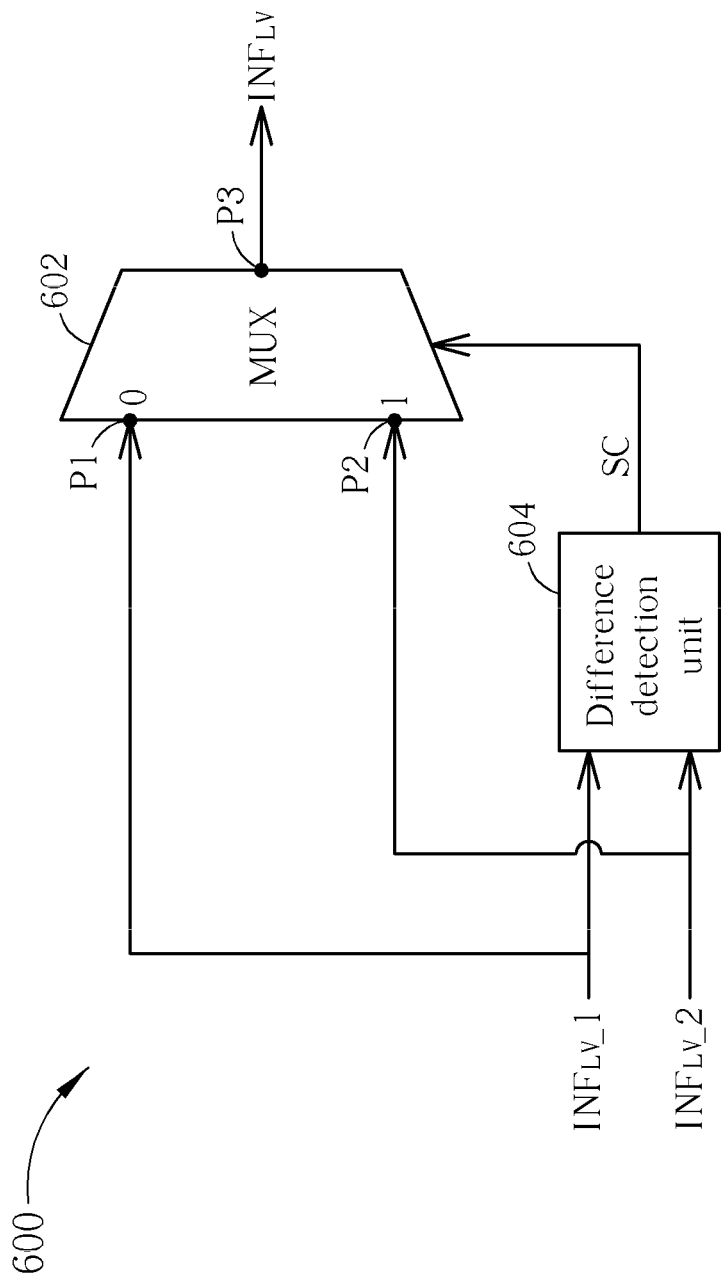
FIG. 6 is a diagram illustrating a first exemplary implementation of the selection unit shown in FIG. 5 according to an exemplary embodiment of the present invention.

FIG. 6 is a diagram illustrating a first exemplary implementation of the selection unit 518 shown in FIG. 5 according to an exemplary embodiment of the present invention. The selection unit 518 shown in FIG. 5 may be implemented by the selection unit 600 shown in FIG. 6. In this exemplary implementation, the selection unit 600 includes a MUX 602 and a difference detection unit 604. The operation of the MUX 602 is similar to that of the MUX 302 shown in FIG. 3, and the difference is that the first input port P1 of the MUX 602 is used for receiving the level information $INF_{LV\_1}$, the second input port P2 of the MUX 602 is used for receiving the level information $INF_{LV\_2}$, and the output port P3 is used for outputting the target level information $INF_{LV}$. The operation of the difference detection unit 604 is similar to that of the difference detection unit 304 shown in FIG. 3, and the difference is that difference detection unit 604 is arranged for generating the control signal SC by detecting difference between the level information $INF_{LV\_1}$ and $INF_{LV\_2}$. Therefore, when the detection result is indicative of the level divergence in the current level information, the level information $INF_{LV\_2}$ is selected as the target level information $INF_{LV}$. Otherwise, the level information $INF_{LV\_1}$ is selected as the target level information $INF_{LV}$. As a person skilled in the art can readily understand details of MUX 602 and difference detection unit 604 shown in FIG. 6 after reading above paragraphs directed to the selection unit 300 shown in FIG. 3, further description is omitted here for brevity.

Figure 7:
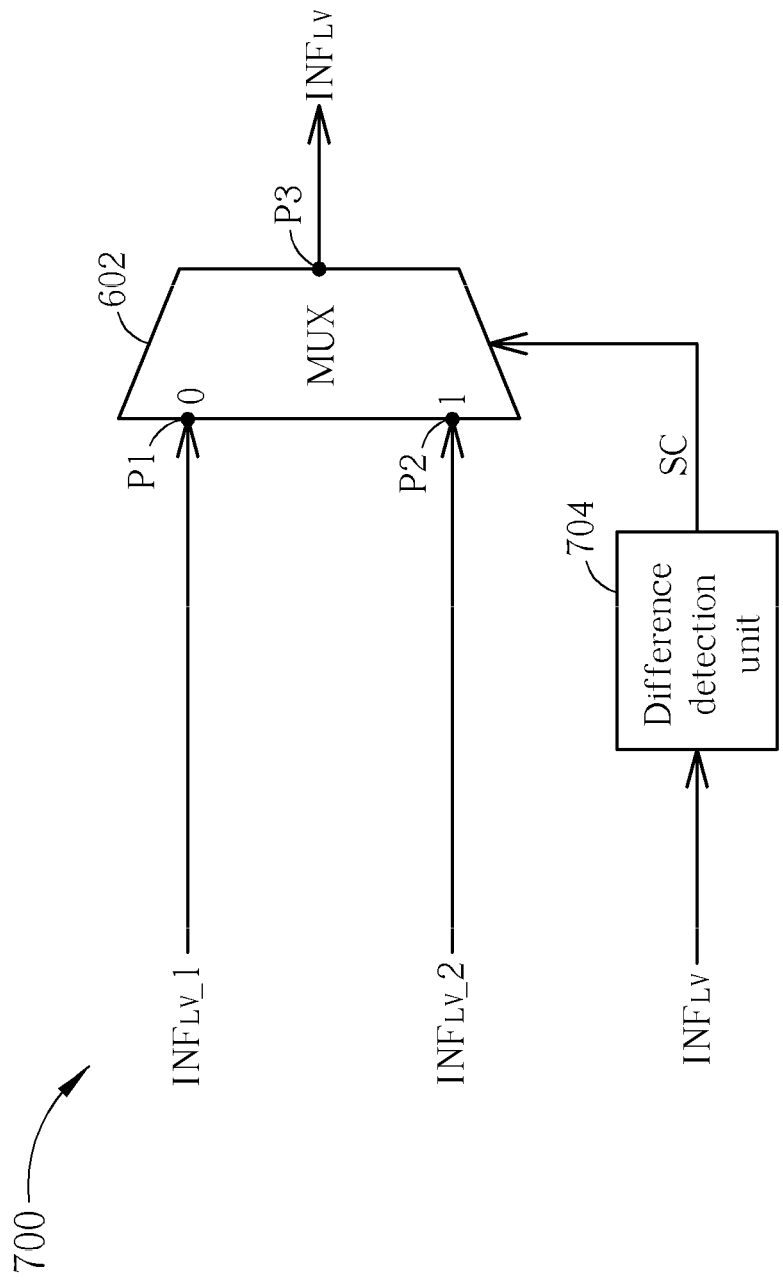
FIG. 7 is a diagram illustrating a second exemplary implementation of the selection unit shown in FIG. 5 according to an exemplary embodiment of the present invention.

FIG. 7 is a diagram illustrating a second exemplary implementation of the selection unit 518 shown in FIG. 5 according to an exemplary embodiment of the present invention. The selection unit 518 shown in FIG. 5 may be implemented by the selection unit 700 shown in FIG. 7. In this exemplary implementation, the selection unit 700 includes a divergence detection unit 704 and the aforementioned MUX 602, where the MUX 602 selectively couples the first input port P1 or the second input port P2 to the output port P3 according to the control signal SC generated from the divergence detection unit 704. When the selection unit 518 is implemented using the selection unit 700, an output of the selection unit 518, which is representative of the current level information used by the Viterbi decoder 502, is fed into the selection unit 518 as indicated by the dashed line shown in FIG. 5. The operation of the divergence detection unit 704 is identical to that of the divergence detection unit 404 shown in FIG. 4. Therefore, when the detection result is indicative of the level divergence in the current level information, the level information $INF_{LV\_2}$ is selected as the target level information $INF_{LV}$. Otherwise, the level information $INF_{LV\_1}$ is selected as the target level information $INF_{LV}$. As a person skilled in the art can readily understand details of MUX 602 and difference detection unit 704 shown in FIG. 7 after reading above paragraphs, further description is omitted here for brevity.

Figure 8:
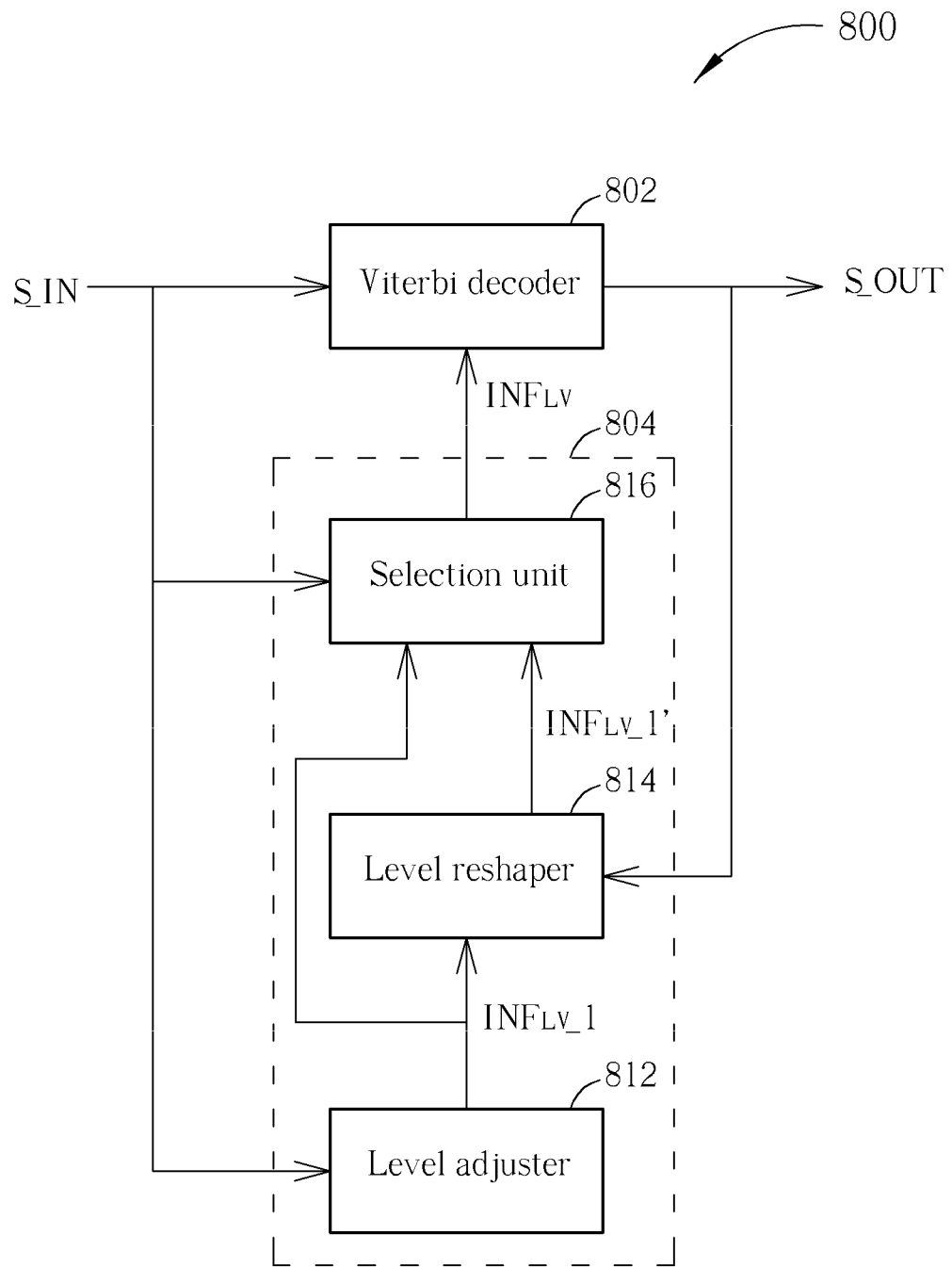
FIG. 8 is a diagram illustrating a third exemplary implementation of the Viterbi decoding apparatus according to an exemplary embodiment of the present invention.

FIG. 8 is a diagram illustrating a third exemplary implementation of the Viterbi decoding apparatus 113 shown in FIG. 1 according to an exemplary embodiment of the present invention. By way of example, but not limitation, the Viterbi decoding apparatus 113 shown in FIG. 1 may be implemented by the Viterbi decoding apparatus 800 shown in FIG. 8. Actually, any electronic device/system using the Viterbi decoding apparatus 800 falls within the scope of the present invention. In this exemplary implementation, the Viterbi decoding apparatus 800 includes a Viterbi decoder 802 and a level information generator 804. The Viterbi decoder 802 is arranged for generating the binary signal S_OUT by decoding the input signal S_IN (e.g., an input derived from the optical storage medium 101 or other signal source) according to target level information $INF_{LV}$. Regarding the level information generator 804, it is arranged for receiving the binary signal S_OUT, and generating the target level information $INF_{LV}$ according to at least the binary signal S_OUT. Specifically, the level information generator 804 includes a level adjuster 812, a level reshaper 814, and a selection unit 816, and supports two hardware configurations controlled by the selection unit 816. The level adjuster 812 is arranged for generating the level information $INF_{LV\_1}$ according to at least the binary signal S_OUT. It should be noted that the level adjuster 812 may be implemented using any feasible hardware structure which can generate the level information according to a level adjuster input (i.e., the binary signal S_OUT). The level reshaper 814 is arranged for adjusting/reshaping the level information $INF_{LV\_1}$ to generate reshaped level information $INF_{LV\_1}'$. For example, the level reshaper 814 may be configured to fine tune levels originally defined in the level information $INF_{LV\_1}$ such that the reshaped level information $INF_{LV\_1}'$ may be free of undesired level divergence. The selection unit 816 is arranged for selecting the target level information $INF_{LV}$ from the level information $INF_{LV\_1}$ and $INF_{LV\_1}'$ when the level information generator 804 operates in the target hardware configuration.

Figure 9:
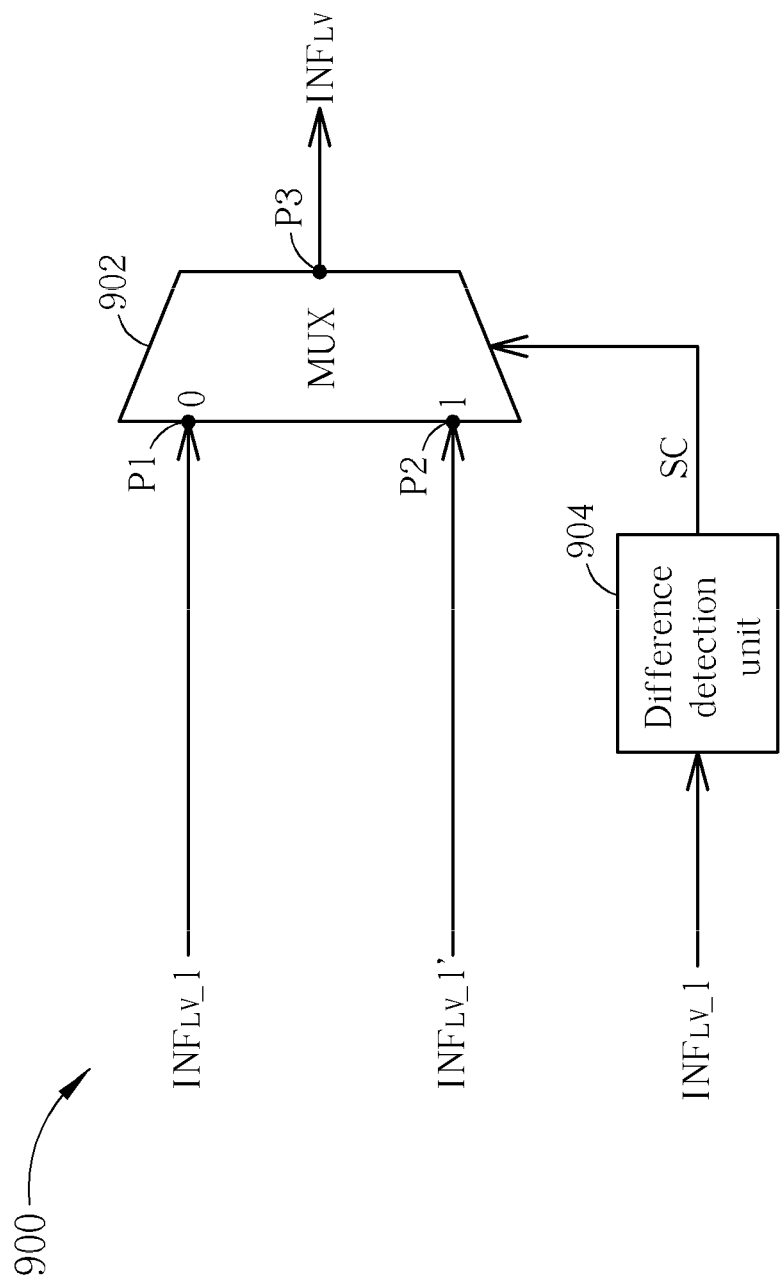
FIG. 9 is a diagram illustrating an exemplary implementation of the selection unit shown in FIG. 8 according to an exemplary embodiment of the present invention.

FIG. 9 is a diagram illustrating an exemplary implementation of the selection unit 816 shown in FIG. 8 according to an exemplary embodiment of the present invention. The selection unit 816 shown in FIG. 8 may be implemented by the selection unit 900 shown in FIG. 9. In this exemplary implementation, the selection unit 900 includes a MUX 902 and a divergence detection unit 904. The operation of the MUX 902 is similar to that of the MUX 302/602 mentioned above, and the difference is that the first input port P1 of the MUX 902 is used for receiving the level information $INF_{LV\_1}$, the second input port P2 of the MUX 602 is used for receiving the reshaped level information $INF_{LV\_1}'$, and the output port P3 is used for outputting the target level information $INF_{LV}$. The operation of the divergence detection unit 904 is similar to that of the divergence detection unit 304/604 mentioned above, and the difference is that divergence detection unit 904 is arranged for generating the control signal SC by checking the level information $INF_{LV}\_1$ (i.e., an output of the level adjuster 812) to detect level divergence in the level information $INF_{LV}\_1$. Therefore, when the detection result is indicative of the level divergence in the level information $INF_{LV}\_1$, the level information $INF_{LV}\_1'$ is selected as the target level information $INF_{LV}$. Otherwise, the level information $INF_{LV}\_1$ is selected as the target level information $INF_{LV}$. As a person skilled in the art can readily understand details of MUX 902 and difference detection unit 904 shown in FIG. 9 after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Viterbi decoding apparatus, comprising:
   a Viterbi decoder, arranged for generating a first binary signal by decoding an input signal according to target level information; and
   a level information generator, arranged to support a plurality of different hardware configurations each for level information generation, and operate in a target hardware configuration among the different hardware configurations to generate the target level information to the Viterbi decoder.

2. The Viterbi decoding apparatus of claim 1, wherein the level information generator comprises:
   a binary signal module, arranged for processing the input signal to generate the second binary signal;
   a selection unit, arranged for selecting a target binary signal from the first binary signal and the second binary signal when the level information generator operates in the target hardware configuration; and
   a level adjuster, arranged for generating the target level information according to at least the target binary signal.

3. The Viterbi decoding apparatus of claim 2, wherein the selection unit comprises:
   a multiplexer, having a first input port for receiving the first binary signal, a second input port for receiving the second binary signal, and an output port for outputting the target binary signal, wherein the multiplexer selectively couples the first input port or the second input port to the output port according to a control signal; and
   a difference detection unit, arranging for detecting difference between the first binary signal and the second binary signal, and generating the control signal according to a detection result.

4. The Viterbi decoding apparatus of claim 2, wherein the selection unit comprises:
   a multiplexer, having a first input port for receiving the first binary signal, a second input port for receiving the second binary signal, and an output port for outputting the target binary signal, wherein the multiplexer selectively couples the first input port or the second input port to the output port according to a control signal; and
   a divergence detection unit, arranging for checking an output of the level adjuster to detect level divergence in the output of the level adjuster, and generating the control signal according to a detection result.

5. The Viterbi decoding apparatus of claim 1, wherein the level information generator comprises:
   a binary signal module, arranged for processing the input signal to generate the second binary signal;
   a first level adjuster, arranged for generating first level information according to at least the first binary signal;
   a second level adjuster, arranged for generating second level information according to at least the second binary signal;
   a selection unit, arranged for selecting the target level information from the first level information and the second level information when the level information generator operates in the target hardware configuration.

6. The Viterbi decoding apparatus of claim 5, wherein the selection unit comprises:
   a multiplexer, having a first input port for receiving the first level information, a second input port for receiving the second level information, and an output port for outputting the target level information, wherein the multiplexer selectively couples the first input port or the second input port to the output port according to a control signal; and
   a difference detection unit, arranging for detecting difference between the first level information and the second level information, and generating the control signal according to a detection result.

7. The Viterbi decoding apparatus of claim 5, wherein the selection unit comprises:
   a multiplexer, having a first input port for receiving the first level information, a second input port for receiving the second level information, and an output port for outputting the target level information, wherein the multiplexer selectively couples the first input port or the second input port to the output port according to a control signal; and
   a divergence detection unit, arranging for checking an output of the multiplexer to detect level divergence in the output of the multiplexer, and generating the control signal according to a detection result.

8. The Viterbi decoding apparatus of claim 1, wherein the level information generator comprises:
   a level adjuster, arranged for generating first level information according to at least the first binary signal;
   a level reshaper, arranged for adjusting the first level information to generate second level information; and
   a selection unit, arranged for selecting the target level information from the first level information and the second level information when the level information generator operates in the target hardware configuration.

9. The Viterbi decoding apparatus of claim 8, wherein the selection unit comprises:
   a multiplexer, having a first input port for receiving the first level information, a second input port for receiving the second level information, and an output port for outputting the target level information, wherein the multiplexer selectively couples the first input port or the second input port to the output port according to a control signal; and
   a divergence detection unit, arranging for checking the first level information to detect level divergence in the first level information, and generating the control signal according to a detection result.

10. A Viterbi decoding method, comprising:
   configuring a level information generator, arranged to support a plurality of different hardware configurations each for level information generation, to operate in a target hardware configuration among the different hardware configurations for generating target level information; and
   generating a first binary signal by performing Viterbi decoding upon an input signal according to the target level information generated from the level information generator.

11. The Viterbi decoding method of claim 10, wherein the step of configuring the level information generator to operate in the target hardware configuration comprises:
- processing the input signal to generate the second binary signal;
- selecting a target binary signal from the first binary signal and the second binary signal; and
- generating the target level information according to at least the target binary signal.

12. The Viterbi decoding method of claim 11, wherein the step of selecting the target binary signal comprises:
- detecting difference between the first binary signal and the second binary signal, and generating a control signal according to a detection result; and
- outputting the target binary signal by performing a multiplexing operation upon the first binary signal and the second binary signal according to the control signal.

13. The Viterbi decoding method of claim 11, wherein the step of selecting the target binary signal comprises:
- checking current level information used by the Viterbi decoding to detect level divergence in the current level information used by the Viterbi decoding, and generating a control signal according to a detection result; and
- outputting the target binary signal by performing the multiplexing operation upon the first binary signal and the second binary signal according to the control signal.

14. The Viterbi decoding method of claim 10, wherein the step of configuring the level information generator to operate in the target hardware configuration comprises:
- processing the input signal to generate the second binary signal;
- generating first level information according to at least the first binary signal;
- generating second level information according to at least the second binary signal; and
- selecting the target level information from the first level information and the second level information.

15. The Viterbi decoding method of claim 14, wherein the step of selecting the target level information comprises:
- detecting difference between the first level information and the second level information, and generating a control signal according to a detection result; and
- outputting the target level information by performing a multiplexing operation upon the first level information and the second level information according to the control signal.

16. The Viterbi decoding method of claim 14, wherein the step of selecting the target level information comprises:
- checking current level information used by the Viterbi decoding to detect level divergence in the current level information used by the Viterbi decoding, and generating a control signal according to a detection result; and
- outputting the target level information by performing a multiplexing operation upon the first level information and the second level information according to the control signal.

17. The Viterbi decoding method of claim 10, wherein the step of configuring the level information generator to operate in the target hardware configuration comprises:
- generating first level information according to at least the first binary signal;
- adjusting the first level information to generate second level information; and
- selecting the target level information from the first level information and the second level information.

18. The Viterbi decoding method of claim 17, wherein the step of selecting the target level information comprises:
- checking the first level information to detect level divergence in the first level information, and generating a control signal according to a detection result; and
- outputting the target level information by performing a multiplexing operation upon the first level information and the second level information according to the control signal.

19. An optical storage system, comprising:
- an optical pickup unit, arranged for accessing an optical storage medium;
- a signal processing unit, arranged for generating an analog radio frequency (RF) signal according to an output of the optical pickup unit;
- an analog-to-digital converter (ADC), arranged for converting the analog RF signal into a digital RF signal; and
- a Viterbi decoding apparatus, comprising:
  - a Viterbi decoder, arranged for generating a binary signal by decoding the digital RF signal according to target level information; and
  - a level information generator, arranged to support a plurality of different hardware configurations each for level information generation, and operate in a target hardware configuration among the different hardware configurations to generate the target level information to the Viterbi decoder.

20. The optical storage system of claim 19, wherein:
- the level information generator is arranged for receiving the input signal and the first binary signal, deriving a second binary signal from the input signal, and generating the target level information according to multiple binary signals including the first binary signal and the second binary signal; or
- the level information generator is arranged for receiving the first binary signal, and generating the target level information according to a single binary signal which is the first binary signal.

* * * * *